US009455539B1

(12) United States Patent
Axelowitz et al.

(10) Patent No.: US 9,455,539 B1
(45) Date of Patent: Sep. 27, 2016

(54) CONNECTOR HAVING PRINTED CIRCUIT WITH EMBEDDED DIE

(71) Applicant: Apple Inc., Cupertino, CA (US)

(72) Inventors: Corey N. Axelowitz, San Francisco, CA (US); Ling Zhang, Santa Clara, CA (US); Shawn Xavier Arnold, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/752,667

(22) Filed: Jun. 26, 2015

(51) Int. Cl.
| | |
|---|---|
| *H01R 13/66* | (2006.01) |
| *H01R 13/6581* | (2011.01) |
| *H01L 23/498* | (2006.01) |
| *H01L 25/065* | (2006.01) |

(52) U.S. Cl.
CPC ....... *H01R 13/665* (2013.01); *H01L 23/49811* (2013.01); *H01L 23/49822* (2013.01); *H01L 23/49827* (2013.01); *H01L 23/49833* (2013.01); *H01L 23/49844* (2013.01); *H01L 25/0657* (2013.01); *H01R 13/6581* (2013.01); *H01L 2225/06558* (2013.01)

(58) Field of Classification Search
CPC ............ H01R 13/665; H01R 13/6581; H01L 23/49811; H01L 23/49822; H01L 23/49827; H01L 23/49833; H01L 23/49844; H01L 25/0657; H01L 2225/06558
USPC ........................................................ 257/772
See application file for complete search history.

(56) References Cited

U.S. PATENT DOCUMENTS

| | | | |
|---|---|---|---|
| 7,554,185 | B2 | 6/2009 | Foong et al. |
| 7,666,035 | B2 * | 2/2010 | Salomon .......... G06K 19/07732 |
| | | | 174/250 |
| 7,944,035 | B2 | 5/2011 | Bol |
| 8,101,458 | B2 | 1/2012 | Kumar et al. |
| 8,685,798 | B2 | 4/2014 | Shao et al. |
| 8,913,402 | B1 | 12/2014 | Berg et al. |
| 2008/0315372 | A1 | 12/2008 | Kuan et al. |
| 2009/0294911 | A1 | 12/2009 | Pagaila et al. |
| 2009/0308652 | A1 | 12/2009 | Shih |
| 2010/0006994 | A1 | 1/2010 | Shim et al. |
| 2011/0045634 | A1 * | 2/2011 | Pagaila ................... H01L 24/19 |
| | | | 438/107 |
| 2014/0068933 | A1 | 3/2014 | Brickner et al. |
| 2014/0134760 | A1 * | 5/2014 | Arnold ................ H01L 23/5389 |
| | | | 438/14 |
| 2014/0162470 | A1 | 6/2014 | Frickner |

OTHER PUBLICATIONS

Axelowitz et al., U.S. Appl. No. 14/734,951, filed Jun. 9, 2015.

* cited by examiner

*Primary Examiner* — Yasser A Abdelaziez
(74) *Attorney, Agent, or Firm* — Treyz Law Group, P.C.; G. Victor Treyz; Joseph F. Guihan

(57) ABSTRACT

An electrical connector may have connector contacts. Protection circuitry in the connector may prevent circuit damage. The protection circuitry may include diodes that shunt excessive voltages to ground. The protection circuitry may be implemented in a semiconductor die. The semiconductor die may be embedded within a substrate layer in a printed circuit. The printed circuit may form the body of the connector. Connector contacts may be formed on upper and lower surfaces of the printed circuit. Conductive structures such as vias in the printed circuit may be used to couple semiconductor die contacts on the semiconductor die to the connector contacts. The semiconductor die may be a double-sided die having first and second semiconductor dies that are bonded to each other in a back-to-back configuration.

19 Claims, 9 Drawing Sheets

CONNECTOR HAVING PRINTED CIRCUIT WITH EMBEDDED DIE

BACKGROUND

This relates generally to connectors, and, more particularly, to incorporating circuitry into connectors.

Electronic devices such as computers, cellular telephones, and other equipment may have connector ports. The connector ports may receive connectors associated with cables and other accessories. For example, a cable may be mated with a connector in a connector port to provide a device with data and power.

Connectors are increasingly being formed in devices in which space is a premium. As a result, many connectors are being miniaturized. Connectors often require ancillary circuitry such as circuitry for implementing electrostatic discharge protection features. However, there is limited space available in miniaturized connectors to provide this circuitry.

It would therefore be desirable to be able to provide improved connectors.

SUMMARY

Electrical connectors may be used to couple electronic equipment together. A connector may have connector contacts that mate with corresponding connector contacts on an associated connector. The connector contacts may be coupled to internal protection circuitry within the connector. The protection circuitry may prevent electrostatic discharge events and other sources of excessive voltages on the connector contacts from damaging circuitry in an accessory or other electronic device associated with the connector. The protection circuitry may include diodes that shunt excessive voltages to ground.

Circuitry for a connector such as overvoltage protection circuitry may be implemented in a semiconductor die. The semiconductor die may be embedded within a substrate layer in a printed circuit. The printed circuit may form the body of the connector. Connector contacts may be formed on upper and lower surfaces of the printed circuit. Conductive structures such as vias in the printed circuit may be used to couple semiconductor die contacts on the semiconductor die to the connector contacts.

The semiconductor die may be a double-sided die having first and second semiconductor dies that are bonded to each other in a back-to-back configuration. Circuitry in the first die may be coupled to connector contacts on the upper surface of the printed circuit. Circuitry in the second die may be coupled to connector contacts on the lower surface of the printed circuit. The first and second dies may be bonded to each other using die attach film or other bonding arrangements.

DETAILED DESCRIPTION

An electronic device may have one or more electrical connector ports. Connectors may be mated together to facilitate the transfer of data and power signals. For example, an electronic device connector may mate with a corresponding connector on a cable or other accessory so that data and/or power may be transferred between the device and accessory.

Figure 1:
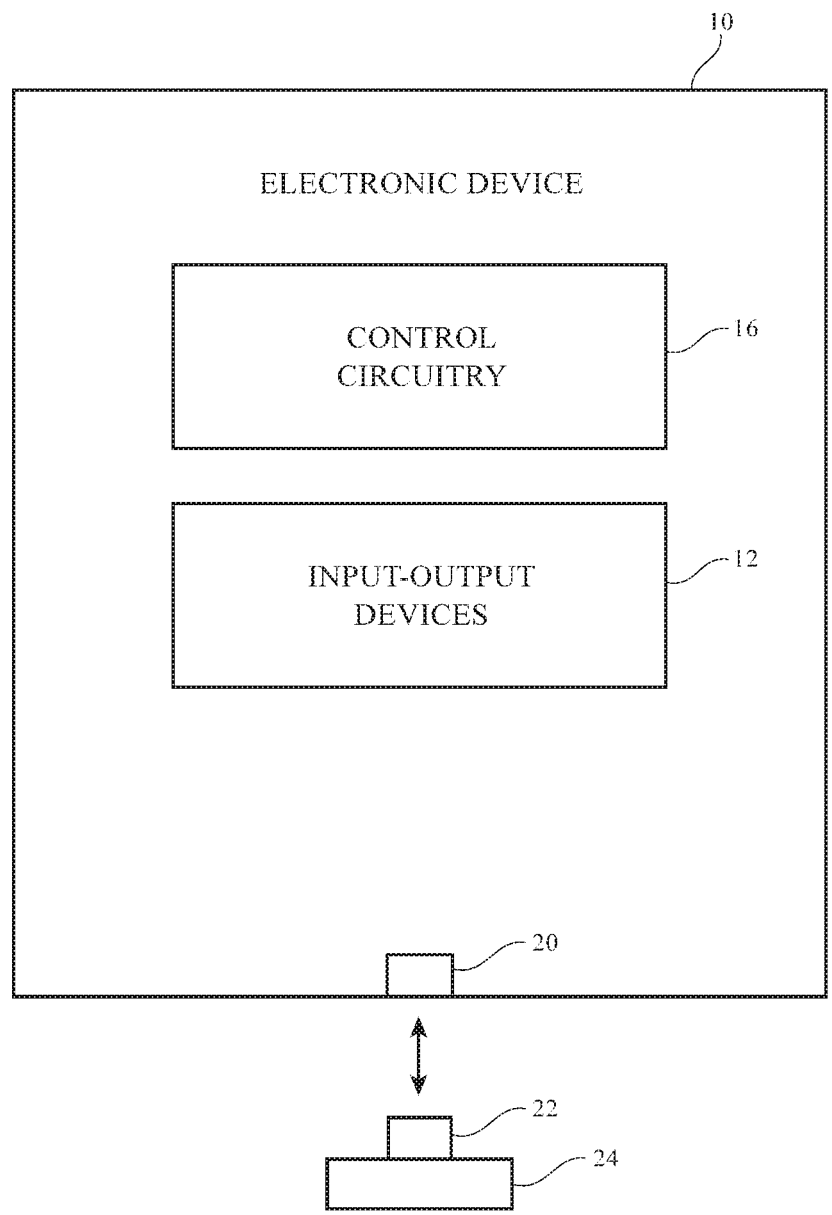
FIG. 1 is a schematic diagram of an illustrative electronic device in accordance with an embodiment.

Illustrative equipment that may include one or more connectors is shown in FIG. 1. The equipment of FIG. 1 includes electronic device 10 and a corresponding electronic device such as accessory 24. Electronic device 10 may be a tablet computer, laptop computer, a desktop computer, a display, a cellular telephone, a media player, a wristwatch device or other wearable electronic equipment, or other suitable electronic device. Device 24 may be a power supply, a data cable, an accessory such as a pair of headphones or a dock that may be coupled to device 10, a case (e.g., a case with a supplemental battery), a memory stick, an adapter, a device such as device 10 (e.g., a peer device), or other suitable electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, displays, etc. A user can control the operation of device 10 by supplying commands through input-output devices 12 and may receive status information and other output from device 10 using the output resources of input-output devices 12.

Device 10 (e.g., input-output devices 12) may include one or more connectors (e.g., Universal Serial Bus connectors (type A, type B, type C, Mini-A, Mini-B, Micro-A, and Micro-B), DisplayPort™, Apple Lightning®, HDMI®, or any other suitable connectors). A connector in device 10 such as connector 20 may be configured to mate with a connector such as connector 22 in accessory (device) 24. Device 24 may include some or all of the components of device 10 and/or other suitable components. Connectors 20 and 22 may be male and/or female connectors. To minimize connector size, connectors such as connectors 20 and 22 may be formed from printed circuits that contain embedded circuitry. The use of a printed circuit with embedded circuitry to form a male connector (e.g., connector 22) is sometimes described herein as an example. This is, however, merely illustrative. A printed circuit with embedded circuitry may be used in forming a connector for device 10, may be used in forming a female connector, or may be used in forming any other suitable type of electronic device structure.

Figure 2:
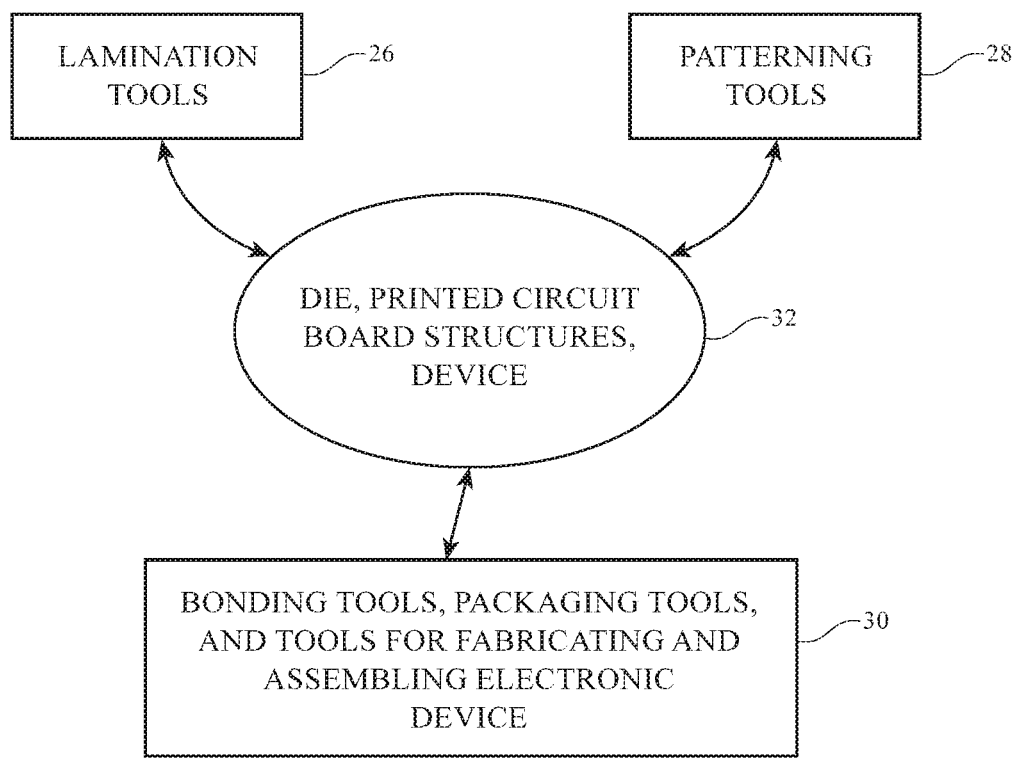
FIG. 2 is a diagram of illustrative equipment of the type that may be used in processing printed circuit and semiconductor die structures for an electronic device in accordance with an embodiment.

Illustrative equipment of the type that may be used in forming printed circuit structures for connectors such as connector 22 and device 20 (and/or connector 20 and device 10) is shown in FIG. 2. As shown in FIG. 2, one or more semiconductor dies, printed circuit board structures, and other connector and device components (shown collectively as structures 32) may be processed using equipment such as equipment 26, 28, and 30. Lamination tools 26 may include equipment for pressing together layers of material such as partially cured printed circuit board cores (sometimes referred to as prepreg), layers of metal, dielectric, etc. Lamination tools 26 may apply heat to help cure the layers that are being laminated together. Patterning tools 28 may include photolithographic tools, etching tools, and other tools for patterning metal layers (e.g., metal layers in printed circuit) to form desired patterns of traces. Tools 30 may be used to form electrical connections (e.g., wire bonds, solder connections, welds, etc.) and may be used to form openings in printed circuit structures (e.g., using stamping, laser drilling, mechanical drilling, cutting, machining, etc.). Electrochemical deposition equipment (e.g., electroplating equipment) and other equipment may be used for forming metal vias in printed circuits. Tools 30 may be used in applying adhesive films and other layers, may be used in removing layers of material, may be used in assembling components of a connector and or device together to form all or part of a completed connector and/or device, and may be used in otherwise processing structures 32.

To conserve space within a connector, it may be desirable to be able to stack electrical components (e.g., multiple semiconductor dies) and to embed the semiconductor dies within printed circuits. A printed circuit with an embedded semiconductor die may then be used in forming a connector. The semiconductor die may include circuitry such as diode circuits or other circuitry that helps protect a device from damage due to overvoltage conditions (e.g., electrostatic discharge events in which electrostatic charge is deposited on one or more of the contacts of a connector). Printed circuits into which semiconductor dies are embedded in this way may be flexible printed circuits (e.g., printed circuits having substrates formed from layers of polyimide or flexible sheets of other polymers) and/or rigid printed circuit boards (e.g., printed circuit boards formed from printed circuit board substrate materials such as fiberglass-filled epoxy).

Figure 3:
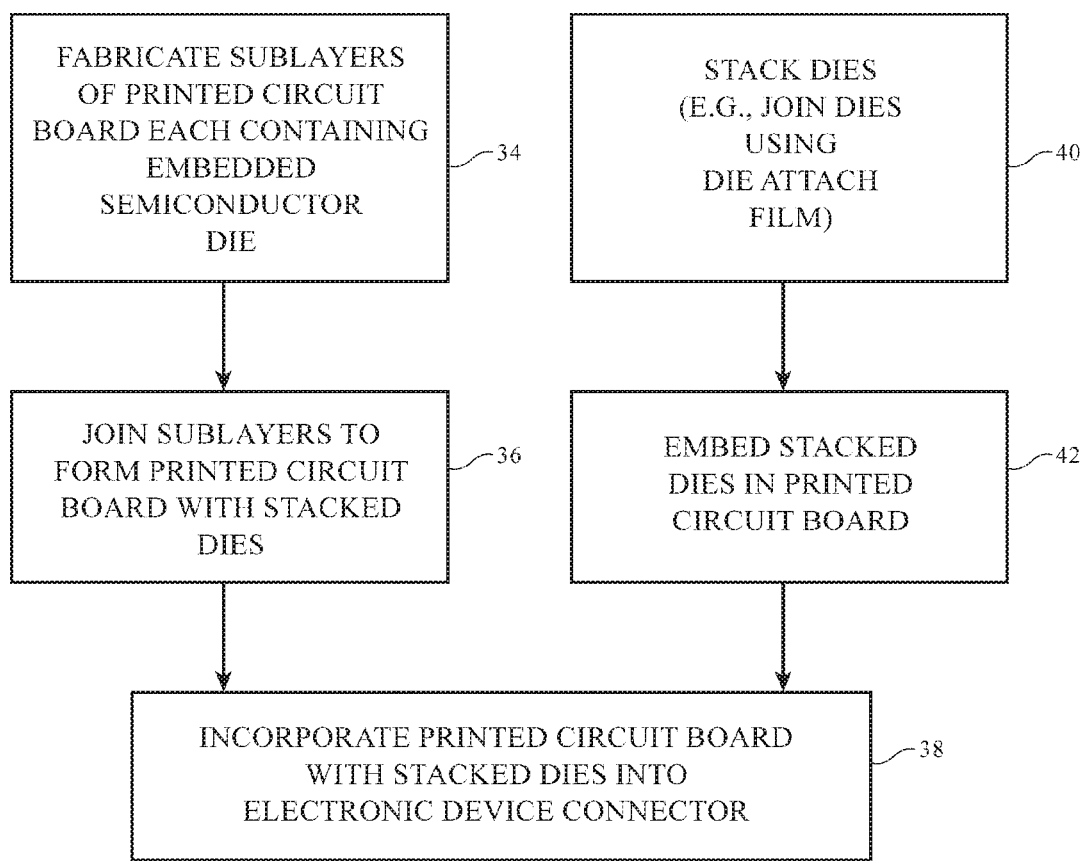
FIG. 3 is a flow chart of illustrative steps involved in forming an electronic device with stacked semiconductor dies in an embedded printed circuit board in accordance with an embodiment.

Illustrative steps involved in forming printed circuits with stacked semiconductor dies are shown in FIG. 3. As shown in FIG. 3, one illustrative approach for forming printed circuits with stacked dies involves fabricating multiple sublayers of printed circuit board material that each include an embedded semiconductor die (step 34) and subsequently joining (e.g., laminating) the sublayers together to form a completed printed circuit (step 36). The printed circuit board with the stacked dies may then be incorporated into a connector 22 (step 38). With another illustrative approach, semiconductor dies are stacked together at step 40 (e.g., using adhesive such as die attach film or other die bonding techniques). After forming stacked semiconductor dies at step 40, the stacked dies may be embedded within a printed circuit (step 42) and assembled with other structures to form connector 22 (step 38).

To increase die density, some or all of the dies embedded in the printed circuit layers that are used to from connectors may be formed using double-sided semiconductor structures. In a double-sided structure, two semiconductor dies (e.g., two silicon dies) may be attached to each other using a layer of die attach film or other adhesive. The die attach film may be thermally conductive, electrically conductive, magnetically conductive, or may have other desired properties. The semiconductor dies that are bonded together in this way may be coupled in a back-to-back configuration (i.e., with their contacts facing away from each other).

Figure 4:
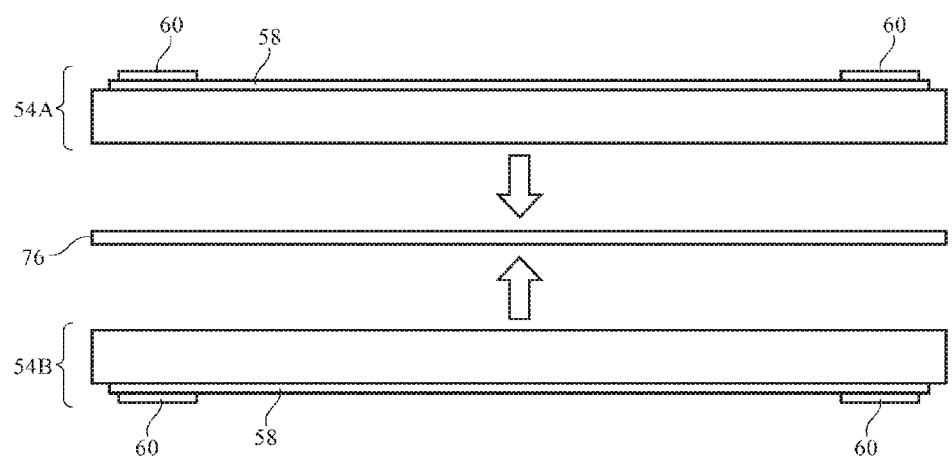
FIG. 4 is a cross-sectional side view of a pair of semiconductor die being bonded using a die attach film in accordance with an embodiment.
Figure 5:
FIG. 5 is a cross-sectional side view of the pair of semiconductor die of FIG. 4 after stacking to form a double-sided die in accordance with an embodiment.

Consider, as an example, the arrangement of FIG. 4. Semiconductor die 54A and 54B of FIG. 4 each include a semiconductor substrate on which circuitry 58 (e.g., diodes, transistors, etc.) and contacts 80 are formed. As shown in FIG. 4, die attach film 76 may be used to attach upper semiconductor die 54A to lower semiconductor die 54B (e.g., using lamination), thereby forming double-sided semiconductor die 54D of FIG. 5. Dies 54A and 54B may be identical or may be different types of devices.

Double-sided semiconductor die 54B (sometimes referred to as a dual stacked semiconductor die) may be embedded within the dielectric substrate material of a printed circuit. The printed circuit may include multiple metal layers interleaved with multiple substrate layers. The metal layers in a printed circuit may be patterned to form metal traces (e.g., to form interconnects). Metals such as copper (e.g., layers of copper foil, electroplated copper, etc.) may be used in forming the printed circuit metal layers. The metal layers in a printed circuit may be separated by dielectric layers. The dielectric layers may be formed from polymers or other insulating materials. In their uncured state, the layers of polymer material in a printed circuit board substrate may be referred to as prepreg layers. After curing (e.g., by application of heat), prepreg is converted to a fully cured (C-stage) state and forms printed circuit board core material. Printed circuit board substrate material such as prepreg material and core material may sometimes be collectively referred to as the substrate material or the substrate layers of a printed circuit.

Figure 6:
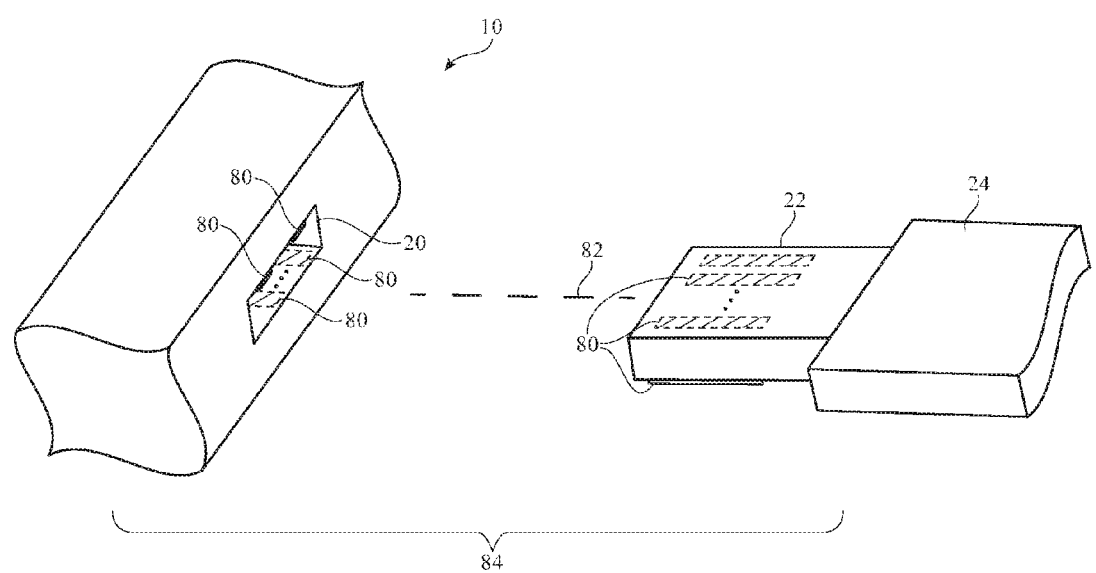
FIG. 6 is a perspective view of an illustrative electronic device port and mating connector in accordance with an embodiment.

FIG. 6 is a perspective view of illustrative connector structures 84. Structures 84 include connector 22 of accessory 24 and associated connector 20 of device 10. As shown in FIG. 6, connectors such as connectors 20 and 22 may have mating contacts 80. Contacts 80 (which may sometimes be referred to as connector pins or pads) may be formed from conductive materials such as metal. When connector 22 is mated with connector 20, contacts 80 of connector 22 mate with corresponding contacts 80 in connector 20. This electrically connects contacts 80 of connector 22 to contacts 80 of connector 20 so that signals can pass between connectors 20 and 22. Connector 22 of FIG. 6 has a body with a rectangular cross sectional shape. The body of connector 22 (and each long side of the box-shaped body in the example of FIG. 6) extends along longitudinal axis 82. Contacts 80 are formed on the upper and lower surfaces of the body of connector 22. Other connector shapes may be used if desired.

Figure 7:
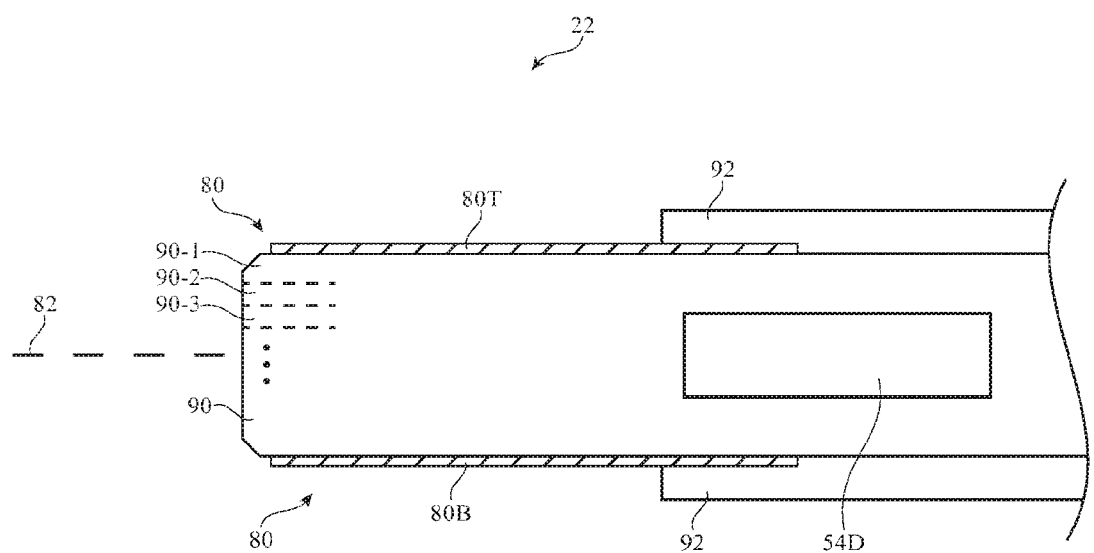
FIG. 7 is a cross-sectional side view of an illustrative connector having a semiconductor device embedded within a printed circuit in accordance with an embodiment.

A cross-sectional side view of an illustrative connector is shown in FIG. 7. As shown in FIG. 7, connector 22 may include circuitry such as semiconductor die 54D. Die 54D may include, for example, diode circuitry (e.g., protection diodes) for providing electrostatic discharge protection (ESD protection) to contacts 80. Die 54D may be implemented using one or more semiconductor die (e.g., silicon die). For example, Die 54D may be a double-sided die having first and second semiconductor die mounted in a back-to-back configuration (i.e., mounted so that a first of the die faces upwards and is coupled to contacts 80T on the upper surface of contact 22 and so that a second of the die faces downwards and is coupled to contacts 80B). Configurations in which a single-sided semiconductor die is used in place of a double-sided die may also be used.

Die 54D may be embedded within printed circuit 90. Printed circuit 90 may make up the body of connector 22. Metal contacts for connector 22 such as upper contacts 80T and lower contacts 80B may be formed on the opposing upper and lower surfaces of printed circuit 90.

Printed circuit 90 may have an elongated shape that extends along longitudinal axis 82, as described in connection with connector 22 of FIG. 6 or may have other suitable shapes. As shown by illustrative layers 90-1, 90-2, and 90-3, . . . , printed circuit 90 may contain multiple layers of material. In particular, printed circuit 90 may contain multiple metal layers that may be patterned to form contacts 80 and internal interconnect layers and may contain multiple dielectric substrate layers (i.e., prepreg which is cured to form printed circuit core material). Die 54D may be embedded within one or more of the substrate layers (e.g., within embedding substrate material that flows from the prepreg material or other material in the substrate layers when heat and pressure is applied during lamination). Metal vias may pass through the substrate layers to interconnect the metal layers (e.g., to interconnect contacts 80 with the circuitry of die 54D). Support structures 92 (e.g., metal support structures, molded plastic or other dielectric support structures, etc.).

Figure 8:
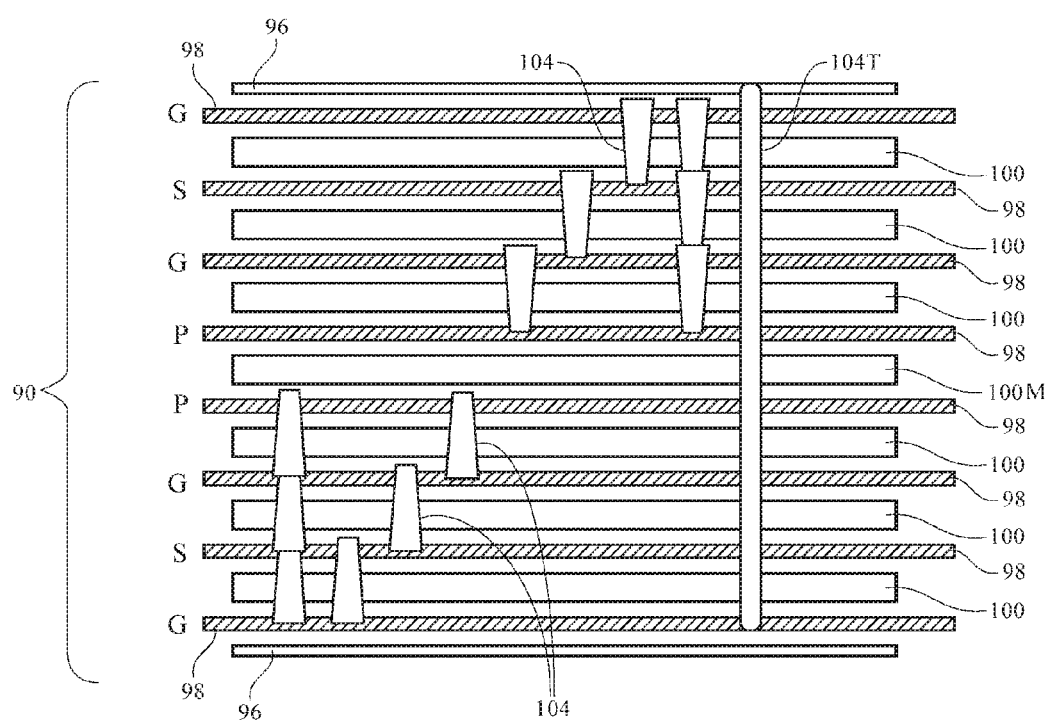
FIG. 8 is a cross-sectional side view of an illustrative printed circuit board that forms a body for a connector in accordance with an embodiment.

A cross-sectional side view of connector 22 in an illustrative configuration in which connector 90 has a body formed from printed circuit 90 is shown in FIG. 8. Dielectric mask layers 96 (sometimes referred to as solder mask layers) may be formed on the top and bottom of printed circuit 90 and may have openings that overlap contacts on the upper surface of printed circuit 90 and contacts on the lower surface of printed circuit 90. Dielectric layers 96 may be formed from polyimide, other polymers, inorganic dielectric, or other dielectric material.

Printed circuit 90 may include metal layers 98 that are interleaved with substrate layers such as substrate layers 100 and 100M. Die 54D may be embedded within one or more of the substrate layers of printed circuit 90. For example, die 54D may be embedded within middle substrate layer 100M or other suitable substrate layer(s) in printed circuit 90.

With the arrangement of FIG. 8, there is a substrate layer interposed between each adjacent pair of metal layers and a metal layer interposed between each adjacent pair of dielectric substrate layers. The metal layers may be patterned to form contacts (on the top and bottom surfaces of printed circuit 90) and to form internal signal paths. Conductive structures such as vias 104 may interconnect the metal layers of printed circuit 90. Vias 104 may pass through via openings in the substrate layers of printed circuit 90. Vias 104 may pass through any single one of the substrate layers or multiple overlapping (aligned) vias 104 may be stacked on top of each other to create signal paths that pass through two or more, three or more, four or more, five or more, six or more, or seven or more substrate layers. As an example, through via 104 has been formed by stacking seven vias on top of each other. Via holes may be formed by laser drilling, etching, or other suitable via hole formation techniques. Metal may be deposited into the via holes to form vias using physical vapor deposition, electrochemical deposition, or other suitable metal deposition and patterning techniques. With one illustrative approach, laser drilling is used to form via holes, a cleaning operation is performed following laser drilling, a metal seed layer is deposited (e.g., using physical vapor deposition) following cleaning, and electrochemical deposition (e.g., electroplating) is used following seed layer deposition to grow a desired amount of metal in the via holes.

The metal layers of printed circuit 90 of FIG. 8 may be used for analog and digital data signals (signals S), ground signals (G), and power supply signals (P). These signals may be routed to contacts 80 using vias 104. Signal layers S may each be sandwiched between upper and lower ground layers G. Substrate layers 100 may be interposed between the ground layers G and signal layers S. Power supply layers P may be located on opposing sides of middle substrate layer 100M. Die 54D may be embedded within middle substrate layer 100M. With one suitable arrangement, metal foil and prepreg layers may be stacked on top of each other and laminated together using heat and pressure. Die 54D may be located in an opening in the substrate layers. When heat and pressure are applied, some of the prepreg material in the substrate layers may flow and form embedding substrate material that holds die 54D in place within printed circuit 90 (i.e., within an opening formed in substrate layer 100M that is filled with the embedding substrate material when the heat and pressure is applied).

By selectively stacking vias 104 on top of each other, vias 104 may be used to form connections through one or more substrate layers. For example, top contacts (see, e.g., contacts 80T of FIG. 7) may be coupled to the internal metal layers of printed circuit 90 using sets of two or more stacked vias 104, which pass through two or more respective substrate layers 100 and bottom contacts (see, e.g., contacts 80B of FIG. 7) may be coupled to the internal metal layers of printed circuit 90 using sets of two or more stacked vias 104 that pass through two or more respective lower substrate layers 100. Vias 104 may also be used in an unstacked configuration (to pass through a single printed circuit substrate layer 100), may be used in stacks of twos (to pass through a pair of printed circuit substrate layers 100), or may be used in stacks of three or more vias to pass through three or more printed circuit substrate layers). Metal traces 98 may be used to route signals laterally (e.g., between a via in one layer and another via in a subsequent layer of printed circuit 90). By using conductive structures in printed circuit 90 such as vias 104 and patterned traces in metal layers 98, conductive paths can be formed that interconnect semiconductor die contacts on die 54D with connector contacts 80.

Figure 9:
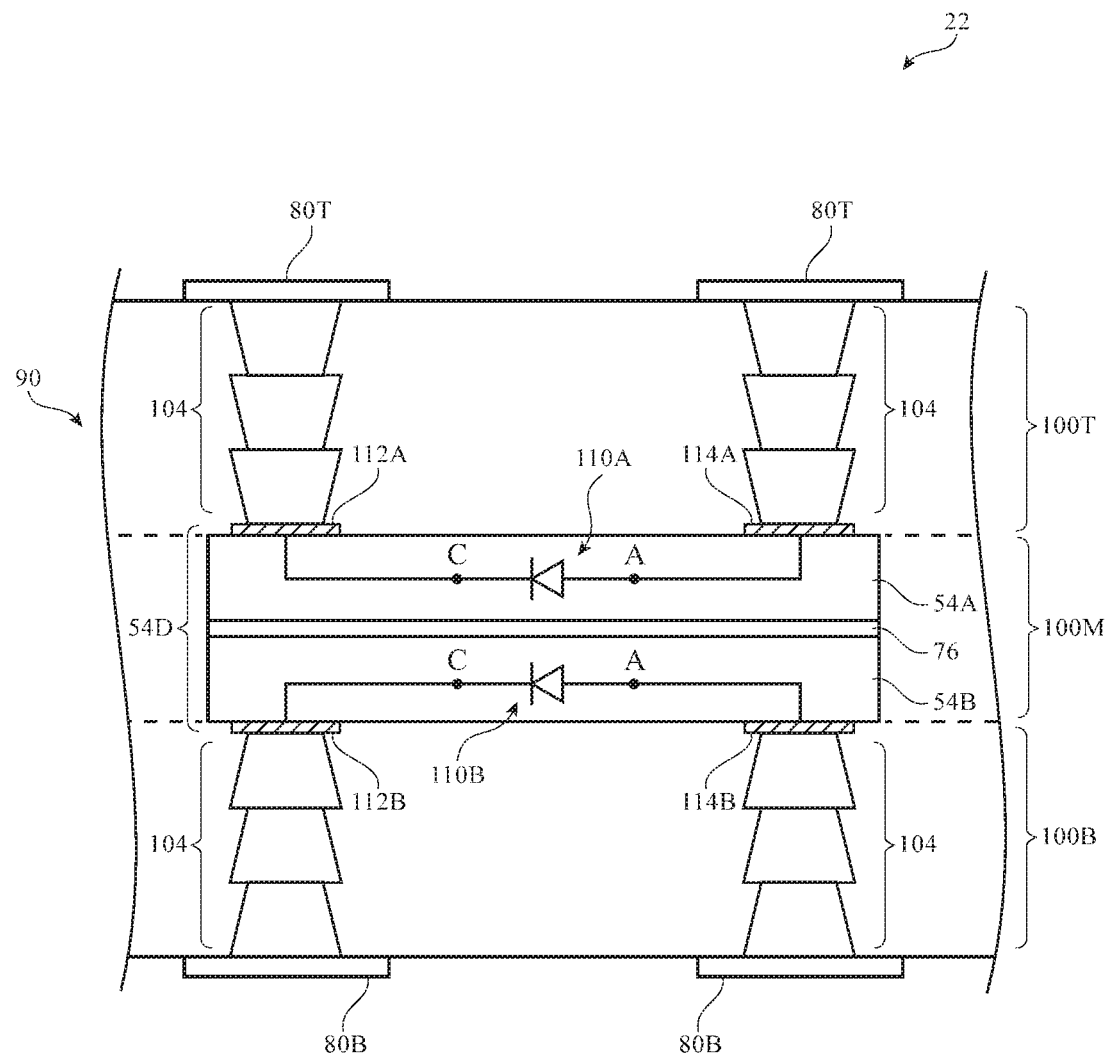
FIG. 9 is a cross-sectional side view of a printed circuit board connector structure having an embedded double-sided semiconductor die in accordance with an embodiment.

As shown in FIG. 9, die 54D may be a double-sided semiconductor die having back-to-back dies 54A and 54B. Stacks of vias 104 may pass through the upper substrate layers 100 of printed circuit 90 (shown collectively as substrate layer 100T) and may pass through the lower substrate layers 100 of printed circuit 90 (shown collectively as substrate layer 100B). Portions of metal layers 98 may be interposed between respective vias 104, as shown in FIG. 8. As shown in FIG. 9, dies 54A and 54B may be coupled together using die attach film 76 or other suitable die bonding technique. A conductive shield layer (e.g., a separate metal foil layer, a deposited metal layer, a conductive adhesive such as a conductive die attach film, etc.) may be interposed between dies 54A and 54B (e.g., in the location shown by die attach film 76 of FIG. 9) to reduce signal interference between dies 54A and 54B.

Die 54D may contain communications circuitry, control circuitry, sensor circuitry, input-output circuitry, or other suitable circuitry. With one illustrative arrangement, which is sometimes described herein as an example, die 54D includes electrostatic discharge protection circuitry (sometimes referred to as overvoltage protection circuitry). The circuitry of die 54D may include, for example, diodes such as diode 110A of die 54A and diode 110B of die 54B. Die 54A may have contacts (pads) such as semiconductor die contacts 112A and semiconductor die contacts 114A. Die 54B may have contacts such as semiconductor die contacts 112B and semiconductor die contacts 114B. Contacts 114A and 114B may be ground contacts. The contacts of dies 54A and 54B may be coupled to upper connector contacts 80T and lower connector contacts 80B using vias 104, as shown in FIG. 9.

Diodes 110A and 110B may have an anode terminal A coupled to a ground contact (e.g., contact 114A, 114B, etc.) and a cathode terminal C coupled to a signal contact (contact 112A, 112B, etc.). The polarity of the protection diodes in die 54D may be arranged to prevent excess voltages from developing (e.g., due to electrostatic charge). During normal operation, diodes 110A and 110B are reverse biased and do not pass significant current. If however, an excessive voltage (e.g., more than 20V, more than 30V, more than 10V, etc.) develops on a signal terminal, the diode can conduct sufficient reverse current (e.g., breakdown current) to discharge the excessive voltage to ground. The use of protection circuits based on diodes or other protection circuitry in dies 54A and 54B therefore helps to prevent damage to the internal circuitry in accessory (device 24). The diode circuitry or other protection circuitry of upwards facing die 54A may prevent excess voltages from developing on upper contacts 80T and the diode circuitry or other protection circuitry of downward facing die 54B may prevent excess voltages from developing on lower contacts 80B.

Double-sided die 54D may be accommodated within a single substrate layer such as substrate layer 100M (as an example), which may help reduce the overall thickness of substrate 90. Layer 100M may be about 0.2 mm thick or other suitable thickness (e.g., more than 0.1 mm, less than 0.3 mm, etc.). Die 54D may be 0.15 mm thick or other suitable thickness (e.g., more than 0.5 mm, less than 0.25 mm, etc.). The metal layers of printed circuit 90 may have thicknesses of 0.05 mm, more than 0.03 mm, less than 0.07 mm, etc. Metal layers may be formed from metal foil, metal deposited using physical vapor deposition, electrochemical deposition (e.g., electroplating of a metal seed layer deposited by physical vapor deposition), using chemical vapor deposition, printed metallized ink traces, or metal deposited using other suitable metal layer formation techniques. Layer 100M may be used to separate metal layers that carry power signals (see, e.g., respective upper and lower power signal layers P in FIG. 8) or other suitable signals.

Figure 10:
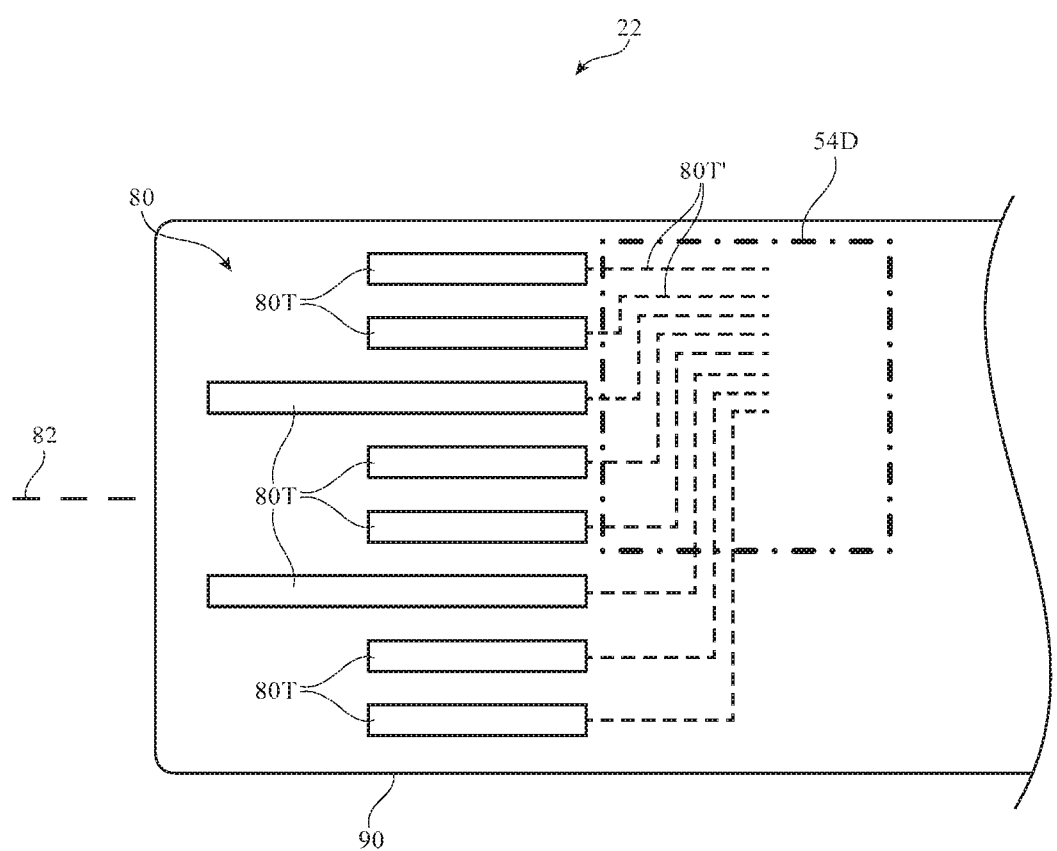
FIG. 10 is a top view of an illustrative connector including an embedded semiconductor die in accordance with an embodiment.

FIG. 10 is a top view of connector 22 showing an illustrative pattern of upper contacts 80T that may be used in forming connector contacts 80 on printed circuit 90 (i.e., the body of connector 22). As shown in FIG. 10, contacts 80T may have extended signal trace portions such as paths 80T' that couple contacts 80 to corresponding contacts on die 54D. Paths 80T' may be formed form portions of contacts 80 on the surface of printed circuit 90, may be formed from traces in internal metal layers 98, and may include vias.

The foregoing is merely illustrative and various modifications can be made by those skilled in the art without departing from the scope and spirit of the described embodiments. The foregoing embodiments may be implemented individually or in any combination.

What is claimed is:

1. A connector, comprising:
   a printed circuit that has opposing upper and lower surfaces;
   a semiconductor die that is embedded in dielectric in the printed circuit and that has semiconductor die contacts;
   connector contacts on the printed circuit, wherein the connector contacts include upper connector contacts on the upper surface and lower connector contacts on the lower surface; and
   conductive structures that couple the semiconductor die contacts to the connector contacts.

2. The connector defined in claim 1 wherein the printed circuit comprises metal layers and substrate layers.

3. The connector defined in claim 2 wherein the dielectric in the printed circuit is formed using material from at least one of the substrate layers.

4. The connector defined in claim 3 wherein the conductive structures include at least one via.

5. The connector defined in claim 4 wherein the metal layers are interposed between the substrate layers.

6. The connector defined in claim 1 wherein the printed circuit comprises metal layers that form signal paths and comprises substrate layers that are interposed between respective pairs of the metal layers and the dielectric in the printed circuit is formed from a given one of the substrate layers.

7. The connector defined in claim 6 wherein the conductive structures include vias that each pass through a respective one of the substrate layers.

8. The connector defined in claim 7 wherein the semiconductor die comprises a double-sided semiconductor die.

9. The connector defined in claim 8 wherein the semiconductor die comprises first and second semiconductor die that are bonded to each other in a back-to-back configuration.

10. The connector defined in claim 9 wherein the printed circuit forms a body for the connector.

11. The connector defined in claim 10 wherein the first and second semiconductor dies each include protection circuitry.

12. The connector defined in claim 11 wherein the first semiconductor die includes diodes coupled to the upper connector contacts and the second semiconductor die includes diodes coupled to the lower connector contacts.

13. The connector defined in claim 12 wherein the double-sided die includes a die attach film that bonds the first semiconductor die to the second semiconductor die.

14. The connector defined in claim 13 wherein the die attach film is conductive and forms a shield layer between the first and second semiconductor dies.

15. A connector, comprising:
- a printed circuit that forms at least part of a body for the connector, wherein the printed circuit has vias that pass through substrate layers and has opposing first and second surfaces;
- connector contacts on the printed circuit, wherein a first set of the connector contacts are on the first surface and a second set of the connector contacts are on the second surface;
- a semiconductor die that is embedded in one of the substrate layers of the printed circuit and that has semiconductor die contacts; and
- vias that pass through the substrate layers and that couple the semiconductor die contacts to the connector contacts.

16. The connector defined in claim 15 wherein the semiconductor die comprises a double-sided semiconductor die having first and second semiconductor dies that are bonded to each other.

17. The connector defined in claim 16 wherein the first semiconductor die has diodes that are coupled to the first set of the connector contacts and the second semiconductor die has diodes that are coupled to the second set of connector contacts.

18. A connector, comprising:
- a printed circuit that forms at least part of a body for the connector, wherein the printed circuit has vias that pass through dielectric substrate layers and has metal layers interposed between respective pairs of the dielectric substrate layers, the metal layers include metal ground layers, the metal layers include metal signal layers each of which is interposed between a respective pair of the metal ground layers, and the metal layers include a pair of metal power layers;
- connector contacts on the printed circuit;
- a double-sided semiconductor die that is embedded in one of the dielectric substrate layers of the printed circuit between the metal power layers and that has semiconductor die contacts; and
- vias that pass through the substrate layers and that couple the semiconductor die contacts to the connector contacts.

19. The connector defined in claim 18 wherein the double-sided semiconductor die comprises protection circuitry including at least one diode coupled to at least one of the connector contacts.

* * * * *